US012684752B2

(12) United States Patent
Zhang et al.

(10) Patent No.: US 12,684,752 B2
(45) Date of Patent: Jul. 14, 2026

(54) SEMICONDUCTOR STRUCTURE AND METHOD OF FORMING SEMICONDUCTOR STRUCTURE

(71) Applicant: Semiconductor Manufacturing International (Shanghai) Corporation, Shanghai (CN)

(72) Inventors: Yijun Zhang, Shanghai (CN); Bo Su, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 407 days.

(21) Appl. No.: 18/403,713

(22) Filed: Jan. 3, 2024

(65) Prior Publication Data

US 2024/0224490 A1     Jul. 4, 2024

(30) Foreign Application Priority Data

Jan. 3, 2023     (CN) ......................... 202310002715.X

(51) Int. Cl.
*H10B 10/00*          (2023.01)
*H10D 89/10*          (2025.01)
(52) U.S. Cl.
CPC ........... *H10B 10/125* (2023.02); *H10D 89/10* (2025.01)

(58) Field of Classification Search
CPC ...... H10B 10/12; H10B 10/125; H10D 89/10; H10D 30/6735; H10D 30/501–509; H10D 86/40–60; G11C 5/06–10
See application file for complete search history.

(56) References Cited

U.S. PATENT DOCUMENTS

2022/0293638 A1*   9/2022   Wang .................... H10D 86/215
2024/0347105 A1*  10/2024   Kim ...................... G11C 11/419

* cited by examiner

*Primary Examiner* — Sue A Purvis
*Assistant Examiner* — Aneta B Cieslewicz
(74) *Attorney, Agent, or Firm* — Anova Law Group, PLLC

(57)     ABSTRACT

Semiconductor structure and forming method thereof are provided. The semiconductor structure includes a substrate and a plurality of transistors located over the substrate. A transistor of the plurality of transistors includes: a channel layer parallel to a substrate surface, a gate structure surrounding the channel layer, and a source/drain doped region located on two sides of the gate structure. The source/drain doped region is in contact with the channel layer, and the gate structure is electrically isolated from the source/drain doped region. The semiconductor structure also includes a first metal structure located over the substrate, and a second metal structure located over the first metal structure and the gate structure. The first metal structure is in contact with the source/drain doped region. The first metal structure, the source/drain doped region and the gate structure are arranged along a first direction. The first direction is parallel to the substrate surface.

20 Claims, 3 Drawing Sheets

| | S101 |
| Providing a substrate | |

| | S102 |
| Forming a plurality of transistors over the substrate | |

| | S103 |
| Forming a first metal structure over the substrate | |

| | S104 |
| Forming a second metal structure over the first metal structure and over a gate structure of the transistor | |

SEMICONDUCTOR STRUCTURE AND METHOD OF FORMING SEMICONDUCTOR STRUCTURE

CROSS-REFERENCE TO RELATED APPLICATION

This application claims priority of Chinese Patent Application No. 202310002715.X, filed on Jan. 3, 2023, the entire content of which is hereby incorporated by reference.

FIELD OF THE DISCLOSURE

The present disclosure generally relates to the field of semiconductor manufacturing and, more particularly, relates to a semiconductor structure and a method of forming the semiconductor structure.

BACKGROUND

Performance of a transistor may improve when dimensions of the transistor decrease, but this is not the case for an interconnect metal. As dimensions of an interconnect metal decrease, contact resistance of the interconnect metal may increase by a factor of approximately 10. Accordingly, resistor-capacitor (RC) delay may appear, and performance may be degraded. In addition, power consumption may increase, and performance of devices in advanced nodes, such as static random-access memory (SRAM), may be affected. As such, problems of contact resistance of devices in high-tech nodes need to be addressed.

BRIEF SUMMARY OF THE DISCLOSURE

One aspect of the present disclosure includes a semiconductor structure. The semiconductor structure includes a substrate and a plurality of transistors located over the substrate. A transistor of the plurality of transistors includes: a channel layer parallel to a surface of the substrate, a gate structure surrounding the channel layer, and a source/drain doped region located on two sides of the gate structure. The source/drain doped region is in contact with the channel layer, and the gate structure is electrically isolated from the source/drain doped region. The semiconductor structure also includes a first metal structure located over the substrate. The first metal structure is in contact with the source/drain doped region, the first metal structure, the source/drain doped region and the gate structure are arranged in a stacked manner along a first direction, and the first direction is parallel to the surface of the substrate. The semiconductor structure also includes a second metal structure located over the first metal structure and over the gate structure. The second metal structure electrically connects the gate structure and the first metal structure.

Optionally, the plurality of transistors includes a first selection transistor, a second selection transistor, a first pull-up transistor, a second pull-up transistor, a first pull-down transistor, and a second pull-down transistor. The first selection transistor includes a first gate, a first source region and a first drain region. The second selection transistor includes a second gate, a second source region and a second drain region. The first pull-down transistor includes a third gate, a third source region and a third drain region. The second pull-down transistor includes a fourth gate, a fourth source region, and a fourth drain region. The first pull-up transistor includes a fifth gate, a fifth source region, and a fifth drain region. The second pull-up transistor includes a sixth gate, a sixth source region and a sixth drain region.

Optionally, the first selection transistor and the second selection transistor include NMOS, the first pull-up transistor and the second pull-up transistor include PMOS, and the first pull-down transistor and the second pull-down transistor include NMOS.

Optionally, the first metal structure includes: a first bit line electrically connected to the first source region; a second bit line electrically connected to the second source region; a first metal layer electrically connected to the fifth drain region, the first drain region and the third drain region; a second metal layer electrically connected to the sixth drain region, the fourth drain region and the second drain region; a power supply voltage line electrically connected to the fifth source region and the sixth source region; and a ground voltage line electrically connected to the third source region and the fourth source region.

Optionally, the third gate and the fifth gate are connected, and the fourth gate and the sixth gate are connected, the third gate and the fifth gate that are connected are parallel to a second direction, the fourth gate and sixth gate that are connected are parallel to the second direction, and the second direction is parallel to the surface of the substrate and perpendicular to the first direction.

Optionally, the second metal structure includes a first plug and a conductive structure located over the first plug. The conductive structure includes a first conductive layer electrically connected to the first metal layer, the fourth gate, and the sixth gate. The fifth drain region, the third drain region, the first drain region, the sixth gate, and the fourth gate are a same node. The conductive structure also includes a second conductive layer electrically connected to the second metal layer, the third gate, and the fifth gate. The sixth drain region, the fourth drain region, the second drain region, the third gate electrode, and the fifth gate electrode are a same node. The conductive structure also includes a word line electrically connected to the first gate and the second gate. The first conductive layer is electrically connected to the first metal layer, the fourth gate and the sixth gate through the first plug, the second conductive layer is electrically connected to the second metal layer, the third gate and the fifth gate through the first plug, and the word line is electrically connected to the first gate and the second gate through the first plug.

Optionally, a top surface of the first plug is higher than or flush with a top surface of the source/drain doped region over the substrate.

Optionally, a height of the first metal structure is less than a height of the source/drain doped region over the substrate.

Optionally, a height of the gate structure is less than a height of the source/drain doped region over the substrate.

Optionally, the source/drain doping region is a sheet-like structure perpendicular to the surface of the substrate.

Another aspect of the present disclosure includes a method of forming a semiconductor structure. The method includes providing a substrate, and forming a plurality of transistors over the substrate. A transistor of the plurality of transistors includes a channel layer parallel to a surface of the substrate, a gate structure surrounding the channel layer, and a source/drain doped region located on two sides of the gate structure. The source/drain doped region is in contact with the channel layer, and the gate structure is electrically isolated from the source/drain doped region. The method also includes forming a first metal structure over the substrate. The first metal structure is in contact with the source/drain doped region, the first metal structure, the source/drain doping region and the gate structure are arranged in a stacked manner along a first direction, and the first direction is parallel to the surface of the substrate. The method also includes forming a second metal structure over the first metal structure and over the gate structure. The second metal structure electrically connects the gate structure and the first metal structure.

Optionally, the plurality of transistors includes a first selection transistor, a second selection transistor, a first pull-up transistor, a second pull-up transistor, a first pull-down transistor, and a second pull-down transistor. The first selection transistor includes a first gate, a first source region and a first drain region. The second selection transistor includes a second gate, a second source region and a second drain region. The first pull-down transistor includes a third gate, a third source region and a third drain region. The second pull-down transistor includes a fourth gate, a fourth source region, and a fourth drain region. The first pull-up transistor includes a fifth gate, a fifth source region, and a fifth drain region. The second pull-up transistor includes a sixth gate, a sixth source region and a sixth drain region.

Optionally, the first metal structure includes: a first bit line electrically connected to the first source region; a second bit line electrically connected to the second source region; a first metal layer electrically connected to the fifth drain region, the first drain region and the third drain region; a second metal layer electrically connected to the sixth drain region, the fourth drain region and the second drain region; a power supply voltage line electrically connected to the fifth source region and the sixth source region; and a ground voltage line electrically connected to the third source region and the fourth source region.

Optionally, the third gate and the fifth gate are connected, and the fourth gate and the sixth gate are connected, the third gate and the fifth gate that are connected are parallel to a second direction, the fourth gate and sixth gate that are connected are parallel to the second direction, and the second direction is parallel to the surface of the substrate and perpendicular to the first direction.

Optionally, the second metal structure includes a first plug and a conductive structure located over the first plug. The conductive structure includes a first conductive layer electrically connected to the first metal layer, the fourth gate, and the sixth gate. The fifth drain region, the third drain region, the first drain region, the sixth gate, and the fourth drain are a same node. The conductive structure also includes a second conductive layer electrically connected to the second metal layer, the third gate, and the fifth gate. The sixth drain region, the fourth drain region, the second drain region, the third gate electrode, and the fifth gate electrode are a same node. The conductive structure also includes a word line electrically connected to the first gate and the second gate. The first conductive layer is electrically connected to the first metal layer, the fourth gate and the sixth gate through the first plug, the second conductive layer is electrically connected to the second metal layer, the third gate and the fifth gate through the first plug, and the word line is electrically connected to the first gate and the second gate through the first plug.

Optionally, a top surface of the first plug is higher than or flush with a top surface of the source/drain doped region over the substrate.

Optionally, a process of forming the plurality of transistors includes forming a plurality of lateral structures over the substrate. The plurality of lateral structures includes a plurality of channel layers and source/drain doping regions located at two ends of a channel layer of the plurality of channel layers, the channel layer is parallel to the first direction, and the plurality of the lateral structures is arranged in a matrix over the substrate. The process also includes removing a part of the plurality of lateral structures, and forming an initial gate structure over the substrate. The initial gate structure spans the plurality of channel layers, and the initial gate structure surrounds the plurality of channel layers. The process also includes removing a part of the initial gate structure to form discrete gate structures.

Optionally, a height of the first metal structure is less than a height of the source/drain doped region over the substrate.

Optionally, a height of the gate structure is less than a height of the source/drain doped region over the substrate.

As disclosed, the technical solutions of the present disclosure have the following advantages.

In the semiconductor structure provided by the present disclosure, the gate structure, the source/drain doped region and the first metal structure are stacked in a direction parallel to the surface of the substrate. Accordingly, the contact area between the source/drain doped region and the first metal structure may be increased. The contact resistance between the source/drain doped region and the first metal structure may be reduced. The aperture length in a direction perpendicular to the substrate may be reduced, and the performance of the semiconductor structure may be improved.

Further, the height of the first metal structure is lower than the height of the source/drain doped regions on the substrate. Accordingly, the area, opposite to the gate structure, of the first metal structure may be small. As such, the parasitic capacitance between the first metal structure and the gate structure may be reduced, and performance of the semiconductor structures may be improved.

Further, the height of the gate structure is lower than the height of the source/drain doped region on the substrate. Accordingly, the area, opposite to the gate structure, of the first metal structure may be small. As such, the parasitic capacitance between the first metal structure and the gate structure may be reduced, and performance of the semiconductor structures may be improved.

BRIEF DESCRIPTION OF THE DRAWINGS

The following drawings are merely example s for illustrative purposes according to various disclosed embodiments and are not intended to limit the scope of the present disclosure.

DETAILED DESCRIPTION

To make the objectives, technical solutions and advantages of the present disclosure clearer and more explicit, the present disclosure is described in further detail with accompanying drawings and embodiments. It should be understood that the specific exemplary embodiments described herein are only for explaining the present disclosure and are not intended to limit the present disclosure.

Reference will now be made in detail to exemplary embodiments of the present disclosure, which are illustrated in the accompanying drawings. Wherever possible, the same reference numbers will be used throughout the drawings to refer to the same or like parts.

Problems of contact resistance of devices in high-tech nodes need to be addressed. Analysis and description will now be carried out with reference to specific embodiments.

Figure 1:
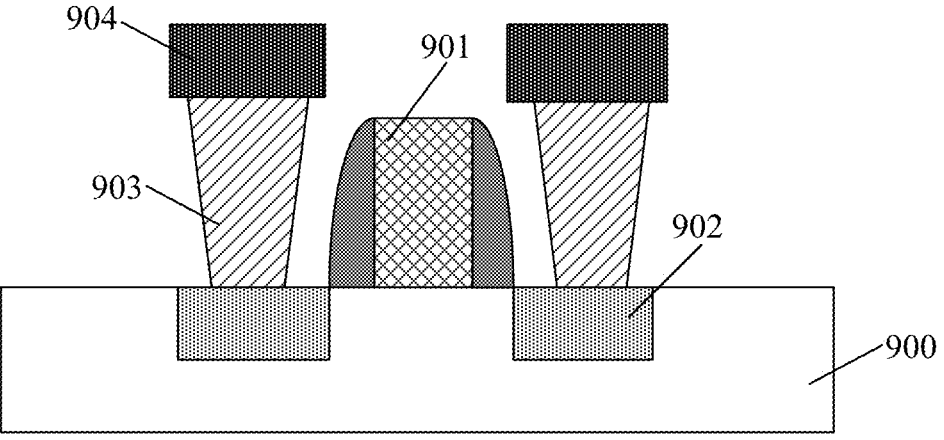
FIG. 1 illustrates a schematic diagram of a semiconductor structure.

FIG. 1 illustrates a schematic diagram of a semiconductor structure. Referring to FIG. 1, the semiconductor structure includes: a substrate 900; a gate structure 901 located over the substrate 900; a spacer (not labeled) located on a sidewall of the gate structure 901; a source/drain doped region 902 located in the substrate 900 on two sides of the gate structure 901; a plug 903 located on the source/rain doped region 902 and electrically connected to the source/drain doped region 902; and a metal layer 904 over the plug 903.

Static random-access memory (SRAM) includes millions of transistors, and may occupy most of a chip area. The metal connection design of 6T SRAM may be a major challenge for 3D GAA FET technology. The semiconductor structure schematically shown in FIG. 1 may be one of the transistors in SRAM.

In the semiconductor structure, the metal layer 904, the plug 903 and the source/drain doped region 902 are vertically stacked over the substrate 900. The vertically stacked semiconductor structure may create a plurality of resistance components. For example: the plurality of resistance components may include resistance of the vertical plug 903, contact resistance between the plug 903 and the source/drain doped region 902, diffusion resistance of the source/drain doped region 902, channel resistance under the gate structure 901, and channel resistance of current from a channel to the source/drain doped region 902.

The contact resistance between the plug 903 and the source/drain doped region 902 may account for a large proportion. Since the source/drain doping region 902 and the plug 903 are in direct contact, when the size of the plug 903 becomes smaller, the contact area between the source/drain doped region 902 and the plug 903 may become smaller, resulting in higher contact resistance. Accordingly, device performance may be degraded, and resistor-capacitor (RC) delay may appear.

To solve the above problems, the present disclosure provides a semiconductor structure and a method of forming the semiconductor structure. In the semiconductor structure, the gate structure, the source/drain doped region and the first metal structure are stacked in a direction parallel to the surface of the substrate. Accordingly, the contact area between the source/drain doped region and the first metal structure may be increased. The contact resistance between the source/drain doped region and the first metal structure may be reduced. The aperture length in a direction perpendicular to the substrate may be reduced, and the performance of the semiconductor structure may be improved.

To make the objects, features and beneficial effects of the present disclosure more obvious and understandable, specific embodiments will be described in detail below with reference to the accompanying drawings.

Figure 2:
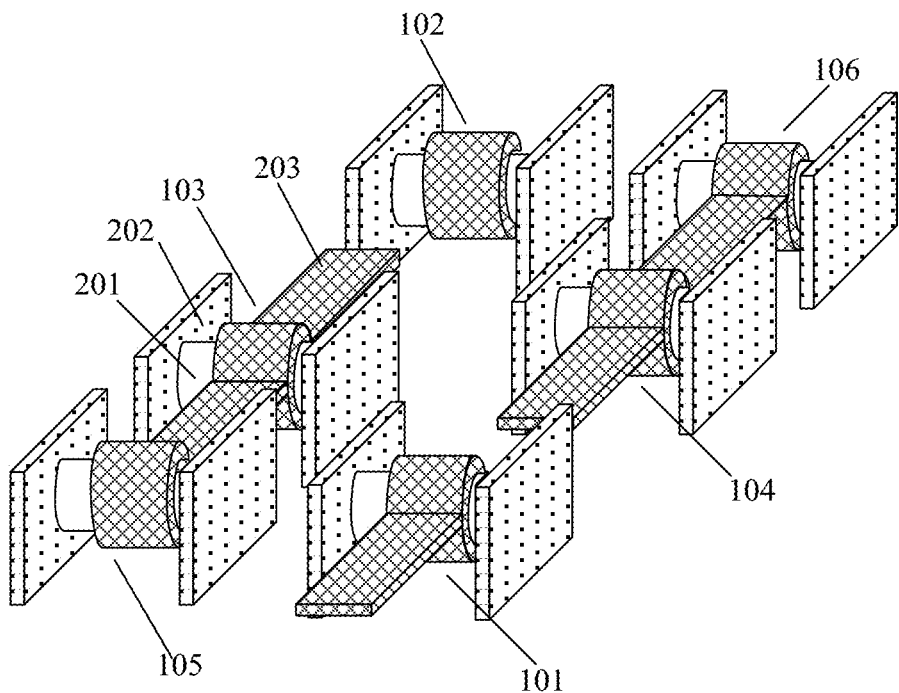
FIGS. 2 to 4 illustrate schematic structural diagrams corresponding to certain stages of an exemplary process of forming a semiconductor structure, consistent with the disclosed embodiments of the present disclosure.
Figure 3:
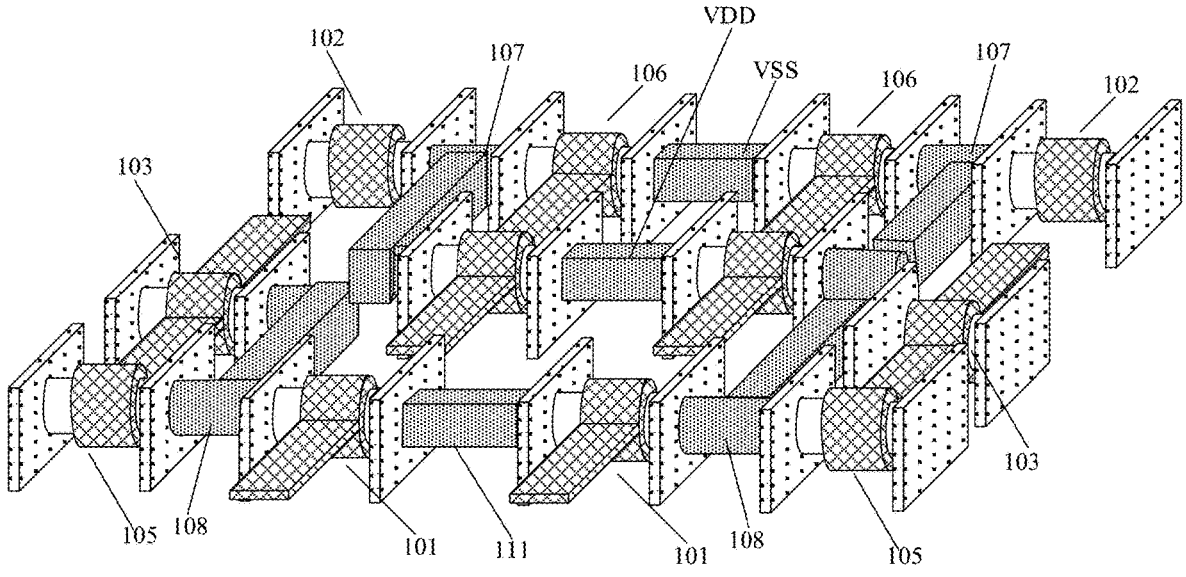
Figure 4:
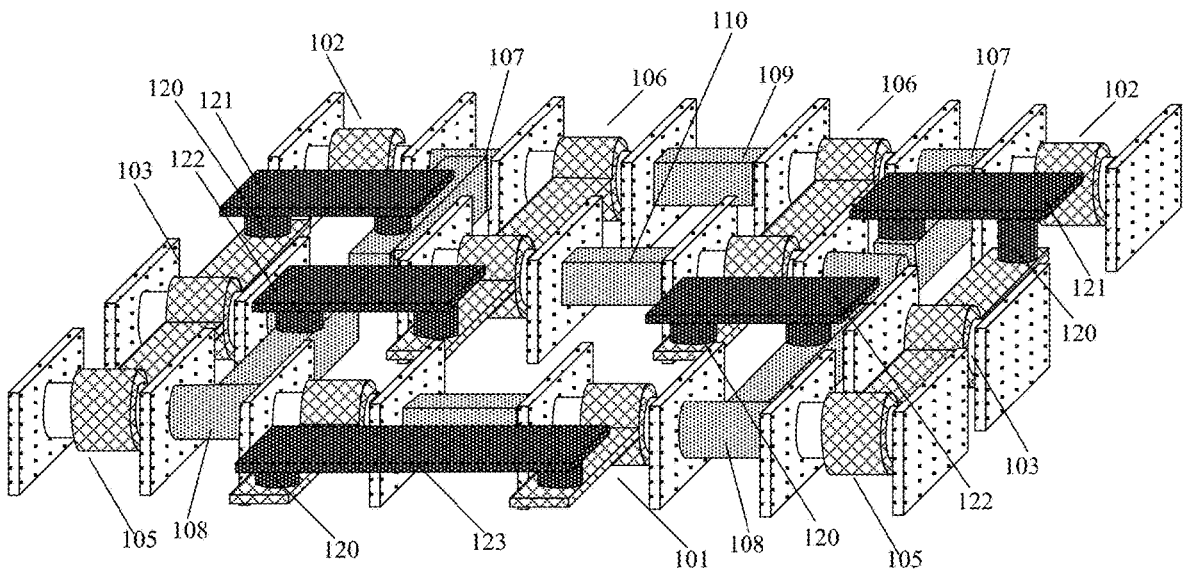
Figure 6:
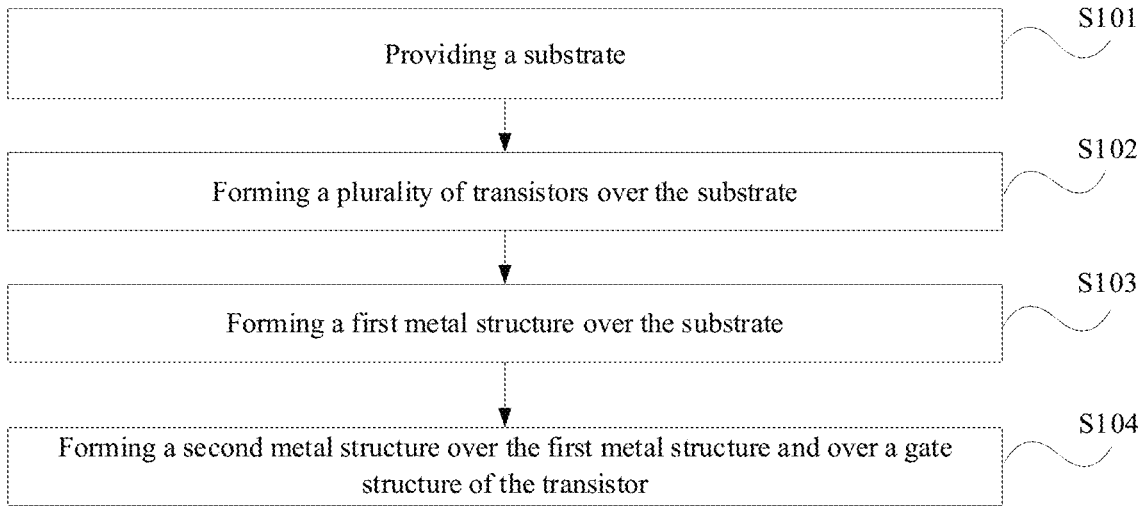
FIG. 6 illustrates a flowchart of an exemplary method of forming a semiconductor structure, consistent with the disclosed embodiments of the present disclosure.

FIG. 6 illustrates a flowchart of an exemplary method of forming a semiconductor structure, consistent with the disclosed embodiments of the present disclosure. FIGS. 2 to 4 illustrate schematic structural diagrams corresponding to certain stages of an exemplary process of forming a semiconductor structure, consistent with the disclosed embodiments of the present disclosure.

As shown in FIG. 6, at the beginning of the method, a substrate may be provided (S101). Referring to FIG. 2, a substrate (not shown) is provided. The substrate includes a base and an insulating layer located over the base.

The substrate is made of a material including silicon, silicon carbide, silicon germanium, multi-element semiconductor materials composed of III-V group elements, silicon on insulator (SOI), germanium on insulator (GOI), or a combination thereof.

The insulating layer is made of a dielectric material including silicon oxide, silicon nitride, silicon carbide, silicon oxycarbide, silicon oxynitride, aluminum oxide, aluminum nitride, silicon oxynitride, silicon oxynitride, or a combination thereof.

Returning to FIG. 6, after providing the substrate, a plurality of transistors may be formed over the substrate (S102). FIG. 2 illustrates a corresponding semiconductor structure.

Referring to FIG. 2, a plurality of transistors is formed over the substrate. The transistor includes: a channel layer 201 parallel to a surface of the substrate, a gate structure 203 surrounding the channel layer 201, and a source/drain doped region 202 located on two sides of the gate structure 203. The source/drain doped region 202 is in contact with the channel layer 201. A plurality of the channel layers 201 is parallel to a first direction, and the first direction is parallel to the surface of the substrate. In one embodiment, the source/drain doping region 202 is a sheet-like structure perpendicular to the surface of the substrate.

When the transistor is PMOS, the source/drain doped region 202 is made of a material including silicon germanium. When the transistor is an NMOS, the source/drain doped regions 202 is made of a material including phosphorus silicon. In one embodiment, the channel layer 201 is made of a material including a semiconductor material, and the semiconductor material includes silicon or germanium.

A process of forming the gate structure 203 includes forming an initial gate structure (not shown) over the substrate. The initial gate structure spans a plurality of the channel layers 201, and the initial gate structure surrounds the plurality of the channel layers 201. The process of forming the gate structure 203 also includes removing a part of the initial gate structure to form discrete gate structures 203.

A process of forming the initial gate structure includes forming a gate structure material layer over the substrate, and patterning the gate structure material layer to form the initial gate structure. The initial gate structure is electrically isolated from the source/drain doped regions 202 on two sides of the initial gate structure.

In one embodiment, the height of the gate structure 203 over the substrate is lower than the height of the source/drain doped region 202 over the substrate. Accordingly, the area, opposite to the gate structure 203, of the subsequently formed first metal structure may be small. As such, the parasitic capacitance between the first metal structure and the gate structure 203 may be reduced, and performance of the semiconductor structures may be improved.

In one embodiment, before patterning the gate structure material layer, the process of forming the initial gate structure also includes etching back the gate structure material layer to make the height of the initial gate structure formed lower than the height of the source/drain doped regions 202 on the substrate.

In one embodiment, the transistors include: a first selection transistor 101, a second selection transistor 102, a first pull-up transistor 103, a second pull-up transistor 104, a first pull-down transistor 105 and a second pull-down transistor 106. The first selection transistor 101 includes a first gate, a first source region and a first drain region. The second selection transistor 102 includes a second gate, a second source region and a second drain region. The first pull-down transistor 105 includes a third gate, a third source region and a third drain region. The second pull-down transistor 106 includes a fourth gate, a fourth source region, and a fourth drain region. The first pull-up transistor 103 includes a fifth gate, a fifth source region, and a fifth drain region. The second pull-up transistor 104 includes a sixth gate, a sixth source region and a sixth drain region.

In one embodiment, the first selection transistor 101 and the second selection transistor 102 include NMOS, the first pull-up transistor 103 and the second pull-up transistor 104 include PMOS, and the first pull-down transistor 105 and the second pull-down transistor 106 include NMOS.

In one embodiment, the third gate and the fifth gate are connected, and the fourth gate and the sixth gate are connected. The third gate and the fifth gate that are connected are parallel to a second direction. The fourth gate and sixth gate that are connected are parallel to the second direction. The second direction is parallel to the surface of the substrate and perpendicular to the first direction.

The gate structure 203 is made of a material including polysilicon or metal, and the metal includes tungsten.

Returning to FIG. 6, after the plurality of transistors is formed over the substrate, a first metal structure may be formed over the substrate (S103). FIG. 3 illustrates a corresponding semiconductor structure.

Referring to FIG. 3, a first metal structure is formed over the substrate. The first metal structure is in contact with the source/drain doped regions 202. The first metal structure, the source/drain doping regions 202 and the gate structure 203 are arranged in a stacked manner along the first direction.

In one embodiment, the first metal structure includes: a first bit line 111 electrically connected to the first source region; a second bit line (not shown) electrically connected to the second source region; a first metal layer 108 electrically connected to the fifth drain region, the first drain region and the third drain region; a second metal layer 107 electrically connected to the sixth drain region, the fourth drain region and the second drain region; a power supply voltage line VDD electrically connected to the fifth source region and the sixth source region; and a ground voltage line VSS electrically connected to the third source region and the fourth source region.

In one embodiment, the first metal structure is electrically connected to the source/drain doped region 202 through a second plug (not labeled). The second plug is parallel to the first direction.

In one embodiment, the height of the first metal structure is lower than the height of the source/drain doped regions 202 on the substrate. Accordingly, the area, opposite to gate structure 203, of the first metal structure may be small. As such, the parasitic capacitance between the first metal structure and the gate structure 203 may be reduced, and performance of the semiconductor structures may be improved.

A process of forming the first metal structure includes: forming a metal material layer on the substrate, the metal material layer being in contact with the source/drain doped regions 202; planarizing the metal material layer to form a transition material layer; etching back the transition material layer to form an initial metal structure, a top surface of the initial metal structure being lower than a top surface of the source/drain doped regions; and removing a part of the metal structure to form the first metal structure.

The first metal structure, the source/drain doping region 202 and the gate structure 203 are arranged in a stacked manner along the first direction, that is, stacked along a direction parallel to the surface of the substrate. Accordingly, the contact area between the source/drain doped region 202 and the first metal structure may be increased, and the contact resistance between the source/drain doped region 202 and the first metal structure may be reduced. The aperture length in a direction perpendicular to the substrate may be reduced, and the performance of the semiconductor structure may be improved.

Returning to FIG. 6, after the first metal structure is formed over the substrate, a second metal structure may be formed over the first metal structure and over the gate structure (S104). FIG. 4 illustrates a corresponding semiconductor structure.

Referring to FIG. 4, a second metal structure is formed over the first metal structure and over the gate structure 203. The second metal structure electrically connects the gate structure 203 and the first metal structure. The second metal structure includes: a first plug 120 and a conductive structure located over the first plug 120.

In one embodiment, the top surface of the first plug 120 is higher than or flush with the top surface of the source/drain doped region 202 over the substrate.

In one embodiment, the conductive structure includes a first conductive layer 122 electrically connected to the first metal layer 108, the fourth gate, and the sixth gate. The fifth drain region, the third drain region, the first drain region, the sixth gate, and the fourth gate are a same node. The conductive structure also includes a second conductive layer 121 electrically connected to the second metal layer 107, the third gate, and the fifth gate. The sixth drain region, the fourth drain region, the second drain region, the third gate electrode, and the fifth gate electrode are a same node. The conductive structure also includes a word line 123 electrically connected to the first gate and the second gate.

The first conductive layer 122 is electrically connected to the first metal layer 108, the fourth gate and the sixth gate through the first plug 120. The second conductive layer 121 is electrically connected to the second metal layer 107, the third gate and the fifth gate through the first plug 120. The word line 123 is electrically connected to the first gate and the second gate through the first plug 120. The first plug is perpendicular to the surface of the substrate.

Figure 5:
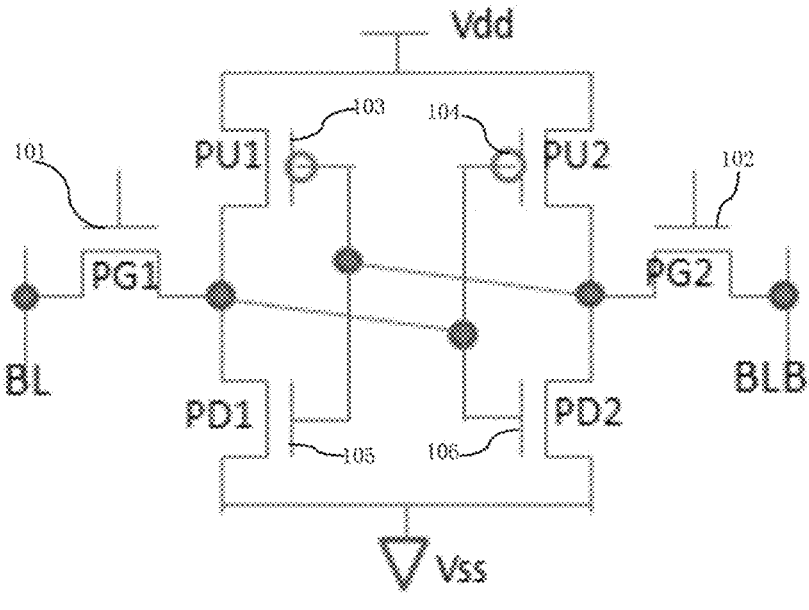
FIG. 5 illustrates a schematic diagram of an electric circuit corresponding to a semiconductor structure consistent with the disclosed embodiments of the present disclosure.

The present disclosure also provides a semiconductor structure. FIG. 5 illustrates a schematic diagram of an electric circuit for a 6T memory cell structure of SRAM. The structure illustrated in FIG. 4 may be a 6T memory cell structure of SRAM. Referring to FIGS. 4 and 5, the semiconductor structure includes a substrate, a plurality of transistors located over the substrate, a first metal structure located over the substrate, and a second metal structure located over the first metal structure and over the gate structure 203.

The transistor includes: a channel layer 201 parallel to a surface of the substrate, a gate structure 203 surrounding the channel layer 201, and a source/drain doped region 202 located on two sides of the gate structure 203. The source/drain doped region 202 is in contact with the channel layer 201. The gate structure 203 is electrically isolated from the source/drain doped regions 202.

The first metal structure is in contact with the source/drain doped region 202. The first metal structure, the source/drain doped region 202 and the gate structure 203 are arranged in a stacked manner along a first direction. The first direction is parallel to a surface of the substrate.

The second metal structure electrically connects the gate structure 203 and the first metal structure.

In one embodiment, the transistors include: a first selection transistor 101, a second selection transistor 102, a first pull-up transistor 103, a second pull-up transistor 104, a first pull-down transistor 105 and a second pull-down transistor 106. The first selection transistor 101 includes a first gate, a first source region and a first drain region. The second selection transistor 102 includes a second gate, a second source region and a second drain region. The first pull-down transistor 105 includes a third gate, a third source region and a third drain region. The second pull-down transistor 106 includes a fourth gate, a fourth source region, and a fourth drain region. The first pull-up transistor 103 includes a fifth gate, a fifth source region, and a fifth drain region. The second pull-up transistor 104 includes a sixth gate, a sixth source region and a sixth drain region.

In one embodiment, the first selection transistor 101 and the second selection transistor 102 include NMOS, the first pull-up transistor 103 and the second pull-up transistor 104 include PMOS, and the first pull-down transistor 105 and the second pull-down transistor 106 include NMOS.

In one embodiment, the first metal structure includes: a first bit line 111 electrically connected to the first source region; a second bit line (not shown) electrically connected to the second source region; a first metal layer 108 electrically connected to the fifth drain region, the first drain region and the third drain region; a second metal layer 107 electrically connected to the sixth drain region, the fourth drain region and the second drain region; a power supply voltage line VDD electrically connected to the fifth source region and the sixth source region; and a ground voltage line VSS electrically connected to the third source region and the fourth source region.

In one embodiment, the third gate and the fifth gate are connected, and the fourth gate and the sixth gate are connected. The third gate and the fifth gate that are connected are parallel to a second direction. The fourth gate and sixth gate that are connected are parallel to the second direction. The second direction is parallel to the surface of the substrate and perpendicular to the first direction.

In one embodiment, the second metal structure includes a first plug 120 and a conductive structure located over the first plug 120. The conductive structure includes a first conductive layer 122 electrically connected to the first metal layer 108, the fourth gate, and the sixth gate. The fifth drain region, the third drain region, the first drain region, the sixth gate, and the fourth gate are a same node. The conductive structure also includes a second conductive layer 121 electrically connected to the second metal layer 107, the third gate, and the fifth gate. The sixth drain region, the fourth drain region, the second drain region, the third gate electrode, and the fifth gate electrode are a same node. The conductive structure also includes a word line 123 electrically connected to the first gate and the second gate. The first conductive layer 122 is electrically connected to the first metal layer 108, the fourth gate and the sixth gate through the first plug 120. The second conductive layer 121 is electrically connected to the second metal layer 107, the third gate and the fifth gate through the first plug 120. The word line 123 is electrically connected to the first gate and the second gate through the first plug 120.

In one embodiment, the top surface of the first plug 120 is higher than or flush with the top surface of the source/drain doped region 202 over the substrate.

In one embodiment, the height of the first metal structure is lower than the height of the source/drain doped regions 202 on the substrate.

In one embodiment, the height of the gate structure 203 is lower than the height of the source/drain doped regions 202 on the substrate.

In one embodiment, the source/drain doping region 202 is a sheet-like structure perpendicular to the surface of the substrate.

The embodiments disclosed in the present disclosure are exemplary only and not limiting the scope of the present disclosure. Various combinations, alternations, modifications, or equivalents to the technical solutions of the disclosed embodiments can be obvious to those skilled in the art and can be included in the present disclosure. Without departing from the spirit of the present disclosure, the technical solutions of the present disclosure may be implemented by other embodiments, and such other embodiments are intended to be encompassed within the scope of the present disclosure.

What is claimed is:

1. A semiconductor structure, comprising:
   a substrate;
   a plurality of transistors located over the substrate, wherein a transistor of the plurality of transistors includes: a channel layer parallel to a surface of the substrate, a gate structure surrounding the channel layer, and a source/drain doped region located on two sides of the gate structure, wherein the source/drain doped region is in contact with the channel layer, and the gate structure is electrically isolated from the source/drain doped region;
   a first metal structure located over the substrate, wherein the first metal structure is in contact with the source/drain doped region, the first metal structure, the source/drain doped region and the gate structure are arranged in a stacked manner along a first direction, and the first direction is parallel to the surface of the substrate; and
   a second metal structure located over the first metal structure and over the gate structure, wherein the second metal structure electrically connects the gate structure and the first metal structure.

2. The semiconductor structure according to claim 1, wherein:
   the plurality of transistors includes a first selection transistor, a second selection transistor, a first pull-up transistor, a second pull-up transistor, a first pull-down transistor, and a second pull-down transistor,
   wherein:
   the first selection transistor includes a first gate, a first source region and a first drain region;
   the second selection transistor includes a second gate, a second source region and a second drain region;
   the first pull-down transistor includes a third gate, a third source region and a third drain region;
   the second pull-down transistor includes a fourth gate, a fourth source region, and a fourth drain region;
   the first pull-up transistor includes a fifth gate, a fifth source region, and a fifth drain region; and
   the second pull-up transistor includes a sixth gate, a sixth source region and a sixth drain region.

3. The semiconductor structure according to claim 2, wherein:

the first selection transistor and the second selection transistor include NMOS;

the first pull-up transistor and the second pull-up transistor include PMOS; and the first pull-down transistor and the second pull-down transistor include NMOS.

4. The semiconductor structure according to claim 2, wherein the first metal structure includes:

a first bit line electrically connected to the first source region;

a second bit line electrically connected to the second source region;

a first metal layer electrically connected to the fifth drain region, the first drain region and the third drain region;

a second metal layer electrically connected to the sixth drain region, the fourth drain region and the second drain region;

a power supply voltage line electrically connected to the fifth source region and the sixth source region; and a ground voltage line electrically connected to the third source region and the fourth source region.

5. The semiconductor structure according to claim 4, wherein:

the third gate and the fifth gate are connected, and the fourth gate and the sixth gate are connected;

the third gate and the fifth gate that are connected are parallel to a second direction;

the fourth gate and sixth gate that are connected are parallel to the second direction; and the second direction is parallel to the surface of the substrate and perpendicular to the first direction.

6. The semiconductor structure according to claim 5, wherein the second metal structure includes a first plug and a conductive structure located over the first plug, wherein:

the conductive structure includes:

a first conductive layer electrically connected to the first metal layer, the fourth gate, and the sixth gate, wherein the fifth drain region, the third drain region, the first drain region, the sixth gate, and the fourth gate are a same node;

a second conductive layer electrically connected to the second metal layer, the third gate, and the fifth gate, wherein the sixth drain region, the fourth drain region, the second drain region, the third gate electrode, and the fifth gate electrode are a same node; and a word line electrically connected to the first gate and the second gate, wherein the first conductive layer is electrically connected to the first metal layer, the fourth gate and the sixth gate through the first plug, the second conductive layer is electrically connected to the second metal layer, the third gate and the fifth gate through the first plug, and the word line is electrically connected to the first gate and the second gate through the first plug.

7. The semiconductor structure according to claim 6, wherein:

a top surface of the first plug is higher than or flush with a top surface of the source/drain doped region over the substrate.

8. The semiconductor structure according to claim 1, wherein:

a height of the first metal structure is less than a height of the source/drain doped region over the substrate.

9. The semiconductor structure according to claim 1, wherein:

a height of the gate structure is less than a height of the source/drain doped region over the substrate.

10. The semiconductor structure according to claim 1, wherein:

the source/drain doping region is a sheet-like structure perpendicular to the surface of the substrate.

11. A method of forming a semiconductor structure, comprising:

providing a substrate;

forming a plurality of transistors over the substrate, wherein a transistor of the plurality of transistors includes a channel layer parallel to a surface of the substrate, a gate structure surrounding the channel layer, and a source/drain doped region located on two sides of the gate structure, wherein the source/drain doped region is in contact with the channel layer, and the gate structure is electrically isolated from the source/drain doped region;

forming a first metal structure over the substrate, wherein the first metal structure is in contact with the source/drain doped region, the first metal structure, the source/drain doping region and the gate structure are arranged in a stacked manner along a first direction, and the first direction is parallel to the surface of the substrate; and forming a second metal structure over the first metal structure and over the gate structure, wherein the second metal structure electrically connects the gate structure and the first metal structure.

12. The method according to claim 11, wherein:

the plurality of transistors includes a first selection transistor, a second selection transistor, a first pull-up transistor, a second pull-up transistor, a first pull-down transistor, and a second pull-down transistor, wherein:

the first selection transistor includes a first gate, a first source region and a first drain region;

the second selection transistor includes a second gate, a second source region and a second drain region;

the first pull-down transistor includes a third gate, a third source region and a third drain region;

the second pull-down transistor includes a fourth gate, a fourth source region, and a fourth drain region;

the first pull-up transistor includes a fifth gate, a fifth source region, and a fifth drain region; and the second pull-up transistor includes a sixth gate, a sixth source region and a sixth drain region.

13. The method according to claim 11, wherein the first metal structure includes:

a first bit line electrically connected to the first source region;

a second bit line electrically connected to the second source region;

a first metal layer electrically connected to the fifth drain region, the first drain region and the third drain region;

a second metal layer electrically connected to the sixth drain region, the fourth drain region and the second drain region;

a power supply voltage line electrically connected to the fifth source region and the sixth source region; and a ground voltage line electrically connected to the third source region and the fourth source region.

14. The method according to claim 12, wherein:

the third gate and the fifth gate are connected, and the fourth gate and the sixth gate are connected;

the third gate and the fifth gate that are connected are parallel to a second direction;

the fourth gate and sixth gate that are connected are parallel to the second direction; and the second direction is parallel to the surface of the substrate and perpendicular to the first direction.

15. The method according to claim 14, wherein the second metal structure includes a first plug and a conductive structure located over the first plug, wherein:

the conductive structure includes:

a first conductive layer electrically connected to the first metal layer, the fourth gate, and the sixth gate, wherein the fifth drain region, the third drain region, the first drain region, the sixth gate, and the fourth gate are a same node;

a second conductive layer electrically connected to the second metal layer, the third gate, and the fifth gate, wherein the sixth drain region, the fourth drain region, the second drain region, the third gate electrode, and the fifth gate electrode are a same node; and a word line electrically connected to the first gate and the second gate, wherein the first conductive layer is electrically connected to the first metal layer, the fourth gate and the sixth gate through the first plug, the second conductive layer is electrically connected to the second metal layer, the third gate and the fifth gate through the first plug, and the word line is electrically connected to the first gate and the second gate through the first plug.

16. The method according to claim 15, wherein:

a top surface of the first plug is higher than or flush with a top surface of the source/drain doped region over the substrate.

17. The method according to claim 11, wherein a process of forming the plurality of transistors includes:

forming a plurality of lateral structures over the substrate, wherein the plurality of lateral structures includes a plurality of channel layers and source/drain doping regions located at two ends of a channel layer of the plurality of channel layers, the channel layer is parallel to the first direction, and the plurality of the lateral structures is arranged in a matrix over the substrate;

removing a part of the plurality of lateral structures;

forming an initial gate structure over the substrate, wherein the initial gate structure spans the plurality of channel layers, and the initial gate structure surrounds the plurality of channel layers; and removing a part of the initial gate structure to form discrete gate structures.

18. The method according to claim 11, wherein:

a height of the first metal structure is less than a height of the source/drain doped region over the substrate.

19. The method according to claim 11, wherein:

a height of the gate structure is less than a height of the source/drain doped region over the substrate.

20. The method according to claim 11, wherein:

the source/drain doping region is a sheet-like structure perpendicular to the surface of the substrate.

* * * * *